(12) United States Patent
Liu et al.

(10) Patent No.: US 7,418,996 B2
(45) Date of Patent: Sep. 2, 2008

(54) INTEGRATED LIQUID COOLING SYSTEM FOR ELECTRONIC COMPONENTS

(75) Inventors: Tay-Jian Liu, Guangdong (CN);
Chih-Hao Yang, Guangdong (CN);
Chao-Nien Tung, Guangdong (CN);
Chuen-Shu Hou, Guangdong (CN)

(73) Assignee: Foxconn Technology Co., Ltd.,
Tu-Cheng, Taipei Hsien (TW)

( * ) Notice: Subject to any disclaimer, the term of this patent is extended or adjusted under 35 U.S.C. 154(b) by 198 days.

(21) Appl. No.: 11/308,278

(22) Filed: Mar. 15, 2006

(65) Prior Publication Data
US 2007/0034353 A1 Feb. 15, 2007

(30) Foreign Application Priority Data
Aug. 12, 2005 (TW) .............................. 94127486 A

(51) Int. Cl.
*F28D 15/00* (2006.01)
*F28F 7/02* (2006.01)
(52) U.S. Cl. ................................. 165/80.4; 165/104.19
(58) Field of Classification Search ................ 165/80.4, 165/80.5, 108, 104.19, 104.22, 104.25, 104.28; 361/698, 699, 702; 257/714
See application file for complete search history.

(56) References Cited

U.S. PATENT DOCUMENTS

| | | | | |
|---|---|---|---|---|
| 6,019,165 A * | 2/2000 | Batchelder | ................. | 165/80.3 |
| 7,149,087 B2 * | 12/2006 | Wilson et al. | ............... | 361/699 |
| 7,204,299 B2 * | 4/2007 | Bhatti et al. | ........... | 165/104.33 |
| 2006/0133039 A1 * | 6/2006 | Belady | ........................ | 361/699 |
| 2006/0213645 A1 * | 9/2006 | Wintersteen et al. | ... | 165/104.19 |
| 2007/0000648 A1 * | 1/2007 | Crocker et al. | ......... | 165/104.33 |
| 2007/0039719 A1 * | 2/2007 | Eriksen | ................. | 165/104.31 |
| 2007/0115634 A1 * | 5/2007 | Laing | ......................... | 361/699 |

FOREIGN PATENT DOCUMENTS

| | | |
|---|---|---|
| CN | 2622658 Y | 6/2004 |
| CN | 2622866 Y | 6/2004 |
| CN | 2664194 Y | 12/2004 |

* cited by examiner

*Primary Examiner*—Teresa J Walberg
(74) *Attorney, Agent, or Firm*—Winston Hsu

(57) ABSTRACT

An integrated liquid cooling system (100) includes a heat absorbing member (10), a heat dissipating member (20) and a pump (15). The heat absorbing member defines therein a fluid flow channel (115) for passage of a coolant. The heat dissipating member is mounted to and maintained in fluid communication with the heat absorbing member. The pump is received in the heat dissipating member and is maintained in fluid communication with the heat absorbing member and the heat dissipating member. The pump is configured for driving the coolant to circulate through the heat absorbing member and the heat dissipating member. The components (i.e., the heat absorbing member, the heat dissipating member and the pump) of the liquid cooling system are combined together to form an integrated structure without utilizing any separate connecting pipes.

15 Claims, 6 Drawing Sheets

INTEGRATED LIQUID COOLING SYSTEM FOR ELECTRONIC COMPONENTS

CROSS-REFERENCES TO RELATED APPLICATION

Relevant subject matter is disclosed in two copending U.S. patent applications filed on the same date and each having a same title with the present application, which are assigned to the same assignee with this patent application.

FIELD OF THE INVENTION

The present invention relates generally to a cooling device, and more particularly to a liquid cooling system with an integrated structure. The liquid cooling system can be suitably applied for removing heat from heat generating electronic components.

DESCRIPTION OF RELATED ART

Along with fast developments in electronic information industries, electronic components such as central processing units (CPUs) of computers are made to be capable of operating at a much higher frequency and speed. As a result, the heat generated by the CPUs during their normal operations is commensurately increased. The generated heat, if not timely removed away from the CPUs, may cause them to become overheated and finally affect the workability and stability of the CPUs. In order to remove the heat of the CPUs and hence to maintain the CPUs to work normally, cooling devices must be provided to the CPUs to dissipate heat therefrom. Conventionally, extruded heat sinks combined with electric fans are frequently used for this heat dissipation purpose. However, these conventional cooling devices prove ineffective and unsatisfactory to cool down the current high speed CPUs.

In recent years, liquid cooling systems have been proposed to remove heat from the current high speed CPUs. As a more effective cooling device, the liquid cooling system generally includes a pump, a heat absorbing member and a heat dissipating member. In practice, these components are connected together in series by a plurality of pipes so as to form a heat transfer loop through which a coolant is circulated. The heat absorbing member is maintained in thermal contact with a CPU for absorbing the heat generated by the CPU. The liquid cooling system employs the coolant circulating through the heat transfer loop so as to bring the heat of the CPU from the heat absorbing member to the heat dissipating member for dissipation. Under the drive of the pump, the coolant as cooled down in the heat dissipating member, is sent back to the heat absorbing member for being available again for heat absorption from the CPU.

The liquid cooling system still has the following drawbacks. Since the pump, the heat absorbing member and the heat dissipating member are connected together by a large number of pipes and fittings, it is difficult to make the resultant liquid cooling system to have a compact structure. The requirement of the large number of pipes and fittings also adds assembly complexity to the liquid cooling system and raises the chance of liquid leakage at the joints between the pipes and the components (i.e., the pump, the heat absorbing member and the heat dissipating member) of the liquid cooling system. In application, mounting of the liquid cooling system will be a tiresome and time-consuming work since the components of the liquid cooling system are required to be addressed individually. Similarly, if the liquid cooling system is desired to be demounted for purposes of repair or replacement, the components thereof are also required to be individually addressed.

Therefore, it is desirable to provide a liquid cooling system which overcomes the foregoing disadvantages.

SUMMARY OF INVENTION

The present invention relates to a liquid cooling system for removing heat from a heat generating component. The liquid cooling system includes a heat absorbing member, a heat dissipating member and a pump. The heat absorbing member is adapted for thermally contacting the heat generating component. The heat absorbing member defines therein a fluid flow channel for passage of a coolant. The heat dissipating member is mounted to and maintained in fluid communication with the heat absorbing member. The pump is received in the heat dissipating member and is maintained in fluid communication with the heat absorbing member and the heat dissipating member. The pump is configured for driving the coolant to circulate through the heat absorbing member and the heat dissipating member. The heat absorbing member, the heat dissipating member and the pump are combined together to form an integrated structure without utilizing any separate connecting pipes or fittings.

Other advantages and novel features of the present invention will become more apparent from the following detailed description of preferred embodiment when taken in conjunction with the accompanying drawings, in which:

DETAILED DESCRIPTION

Figure 1:
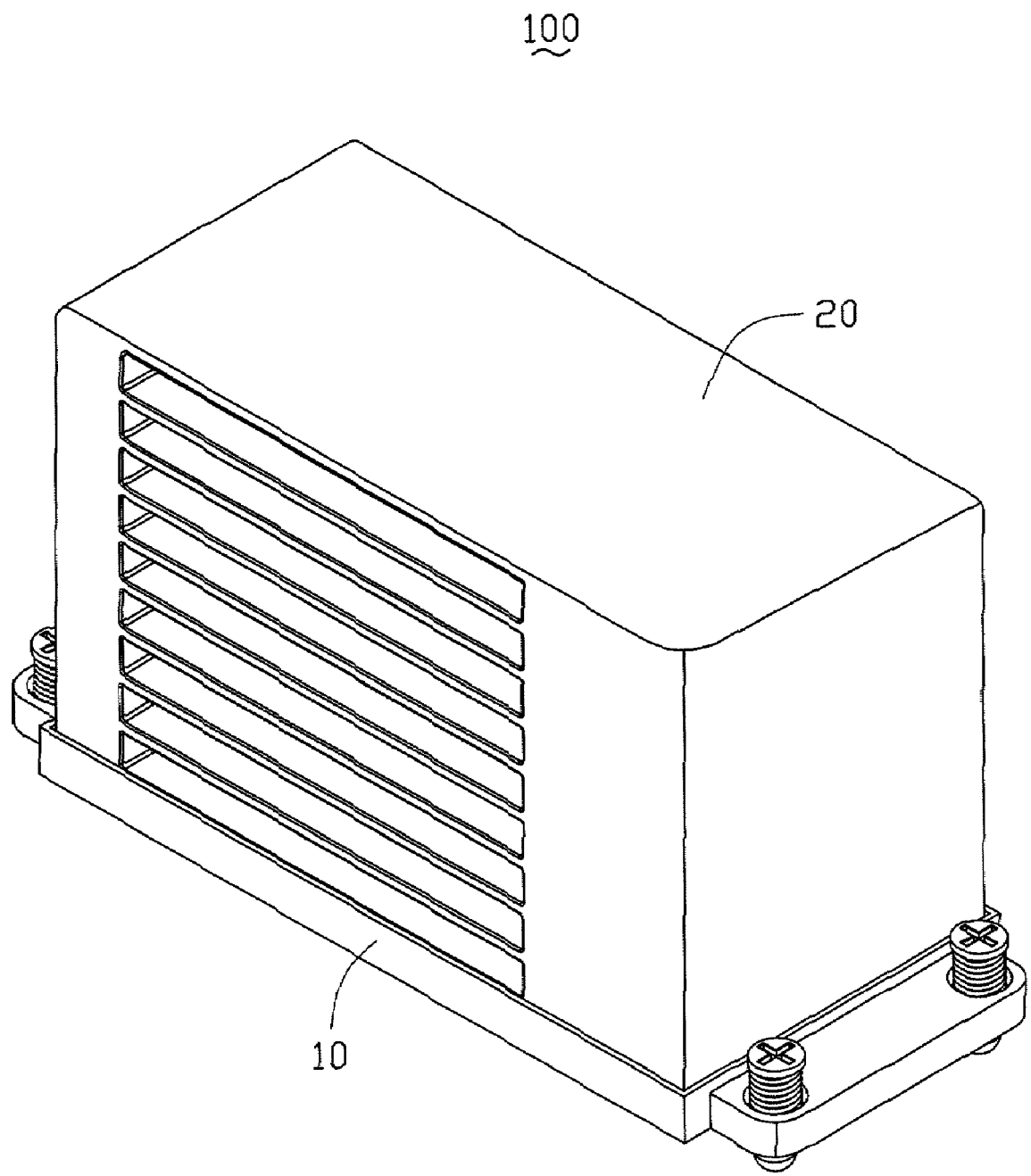
FIG. 1 is an isometric view of a liquid cooling system in accordance with one embodiment of the present invention.
Figure 2:
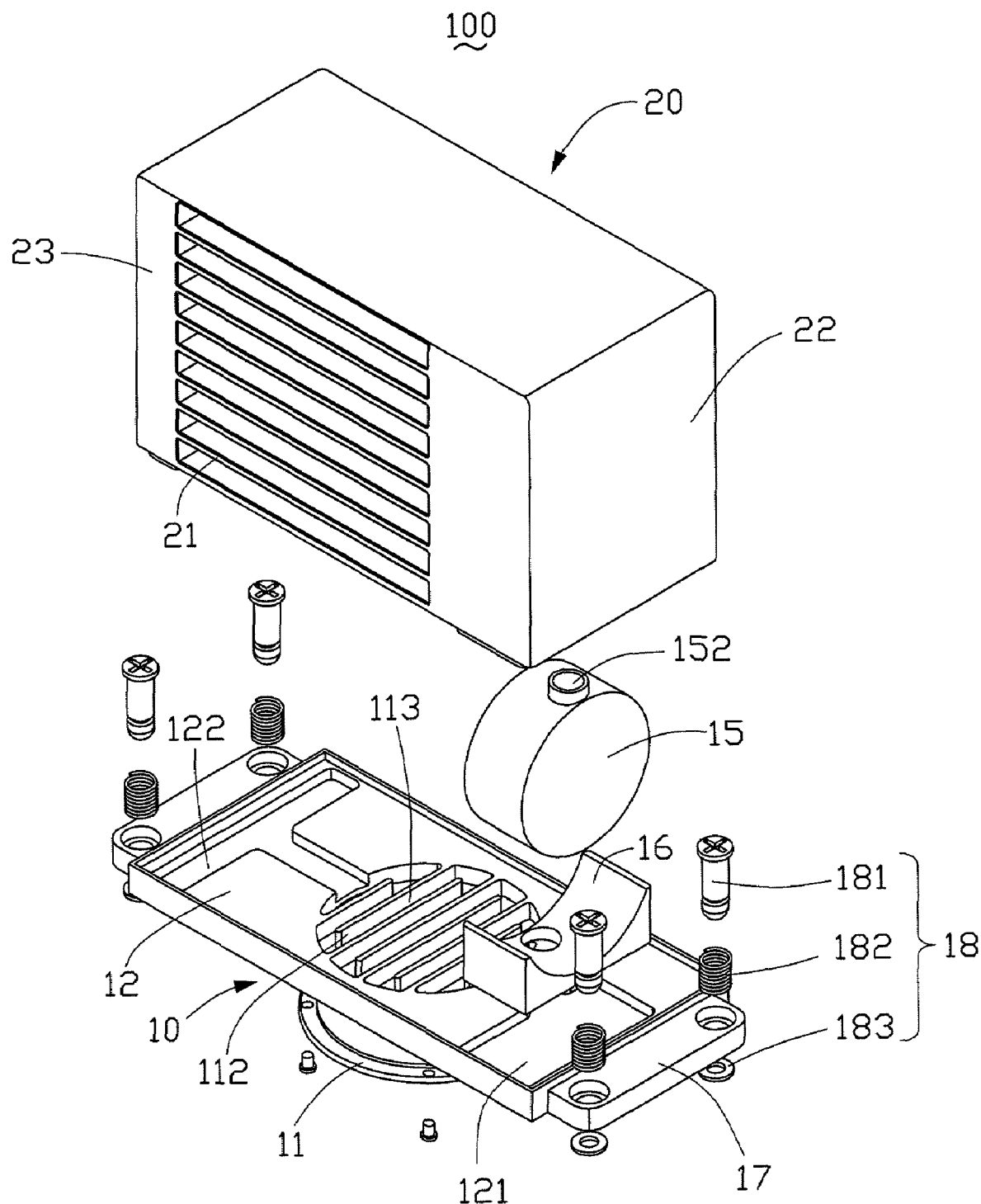
FIG. 2 is an exploded, isometric view of the liquid cooling system of FIG. 1.
Figure 3:
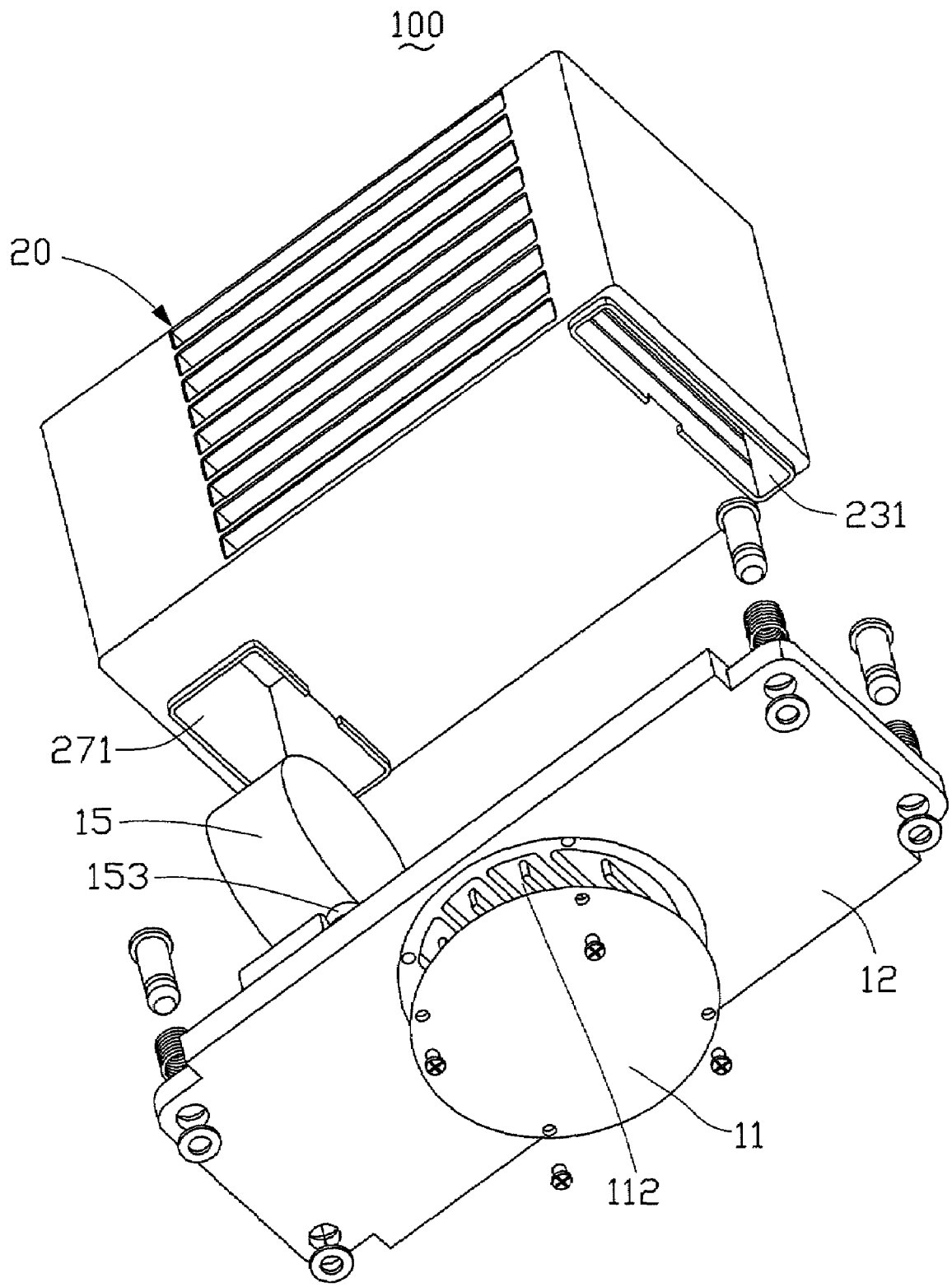
FIG. 3 is similar to FIG. 2, but viewed from another aspect.

FIGS. 1-3 illustrate a liquid cooling system 100 in accordance with one embodiment of the present invention. The liquid cooling system 100 has an integrated structure, which includes a heat absorbing member 10, a pump 15 and a heat dissipating member 20.

The heat absorbing member 10 substantially has a plate-type rectangular configuration, which includes a heat absorbing plate 11 and a supporting base 12 to which the heat dissipating member 20 is supportively mounted. The heat absorbing plate 11 has a round profile, and is adopted for thermally contacting a heat generating component (not shown) such as a central processing unit (CPU) of a computer. The heat absorbing plate 11 is made independently of the supporting base 12 and typically is made of highly thermally conductive material such as copper or aluminum. In order to lower down the total manufacturing cost for the heat absorbing member 10, the supporting base 12 is preferably made of plastic material by methods such as injection molding.

Figure 4:
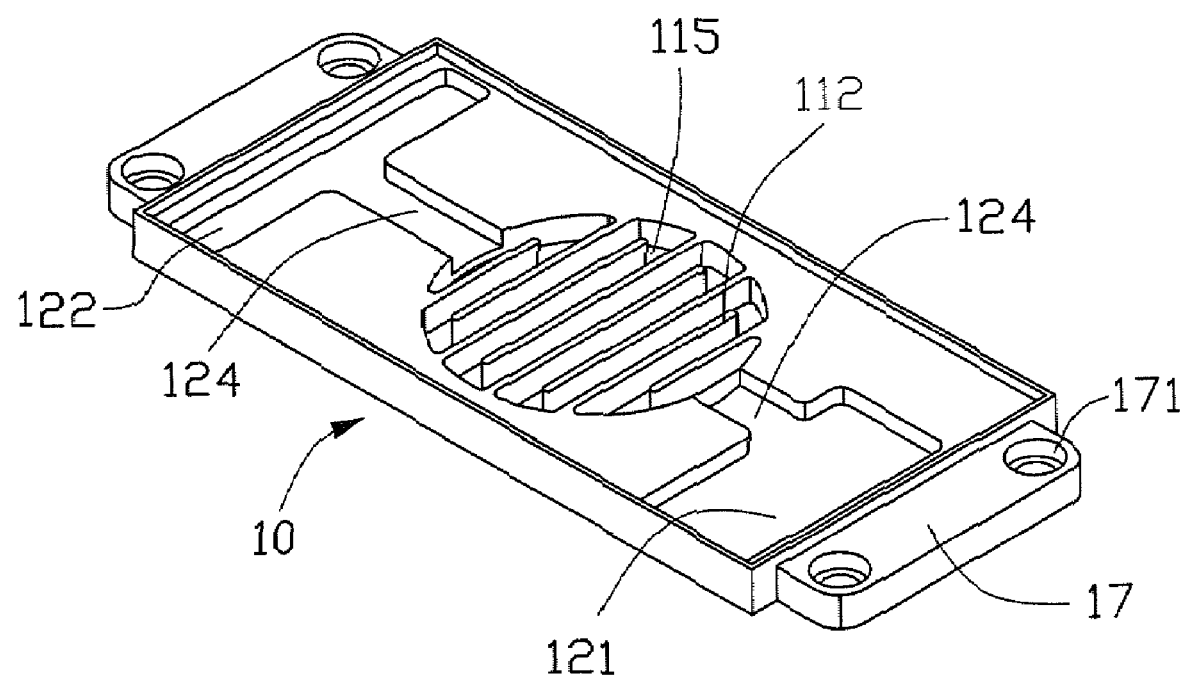
FIG. 4 is an isometric view of a heat absorbing member of the liquid cooling system of FIG. 1.

A central portion of the supporting base 12 is formed to have a plurality of partition plates 112, which are arranged in parallel with each other with an elongated slot 113 being defined between every adjacent two partition plates 112. This central portion has a size substantially the same as that of the heat absorbing plate 11. These partition plates 112 are so designed that, after the heat absorbing plate 11 is attached to a bottom of the supporting base 12 to seal an underside of each of the slots 113 defined between these partition plates 112, a fluid flow channel 115 having a plurality of turns is continuously formed by the slots 113 for passage of a coolant such as water to absorb the heat generated by the CPU, as shown in FIG. 4. In this embodiment, the fluid flow channel 115 has a serpentine configuration. The heat absorbing plate 11 is attached to the supporting base 12 by a plurality of screws (not labeled) as shown in FIGS. 2-3, although other methods such as gluing are also suitable.

The supporting base 12 defines a pair of rectangular recesses, i.e., first recess 121 and second recess 122, at two opposite longitudinal sides thereof. A connecting passage 124 is further defined in the supporting base 12 to interconnect the fluid flow channel 115 and the recesses 121, 122, whereby the fluid flow channel 115 is in fluid communication with these recesses 121, 122 through the connecting passage 124. A pair of flanges 17 further extends outwardly from the longitudinal sides of the supporting base 12, respectively. Each flange 17 defines therein a pair of mounting holes 171 each for receiving a fastener 18 used for securing the liquid cooling system 100 to the computer in which the CPU is mounted. The fastener 18 includes a pin 181, a spring 182 and a washer 183.

Figure 5:
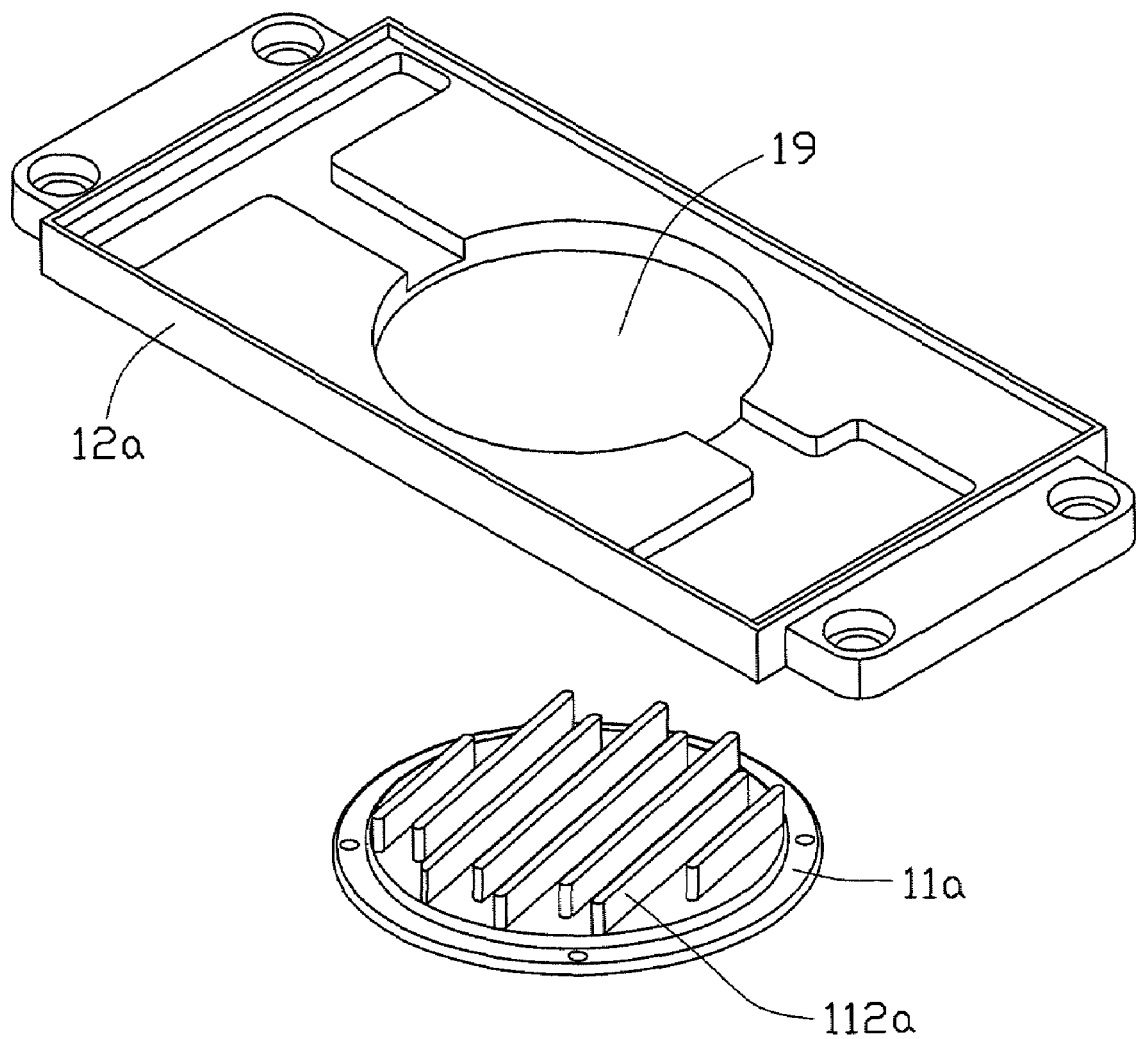
FIG. 5 is an exploded, isometric view of another example of the heat absorbing member of FIG. 4.

FIG. 5 shows another example of the heat absorbing member 10. In this example, the partition plates 112a as used to form the fluid flow channel 115 are integrally formed with the heat absorbing plate 11a. Accordingly, the supporting base 12a in this example defines a through hole 19 at a central portion thereof for receiving the partition plates 112a of the heat absorbing plate 11a. The partition plates 112a in this example are made of highly thermally conductive material such as copper or aluminum and hence operate to increase the heat exchange surface area of the heat absorbing plate 11a a with the coolant as it flows through the fluid flow channel 115, thereby increasing the heat exchange rate between the CPU and the heat absorbing member 10. The other structures of this example are the same as that of the heat absorbing member 10 as particularly shown in FIG. 4.

Figure 6:
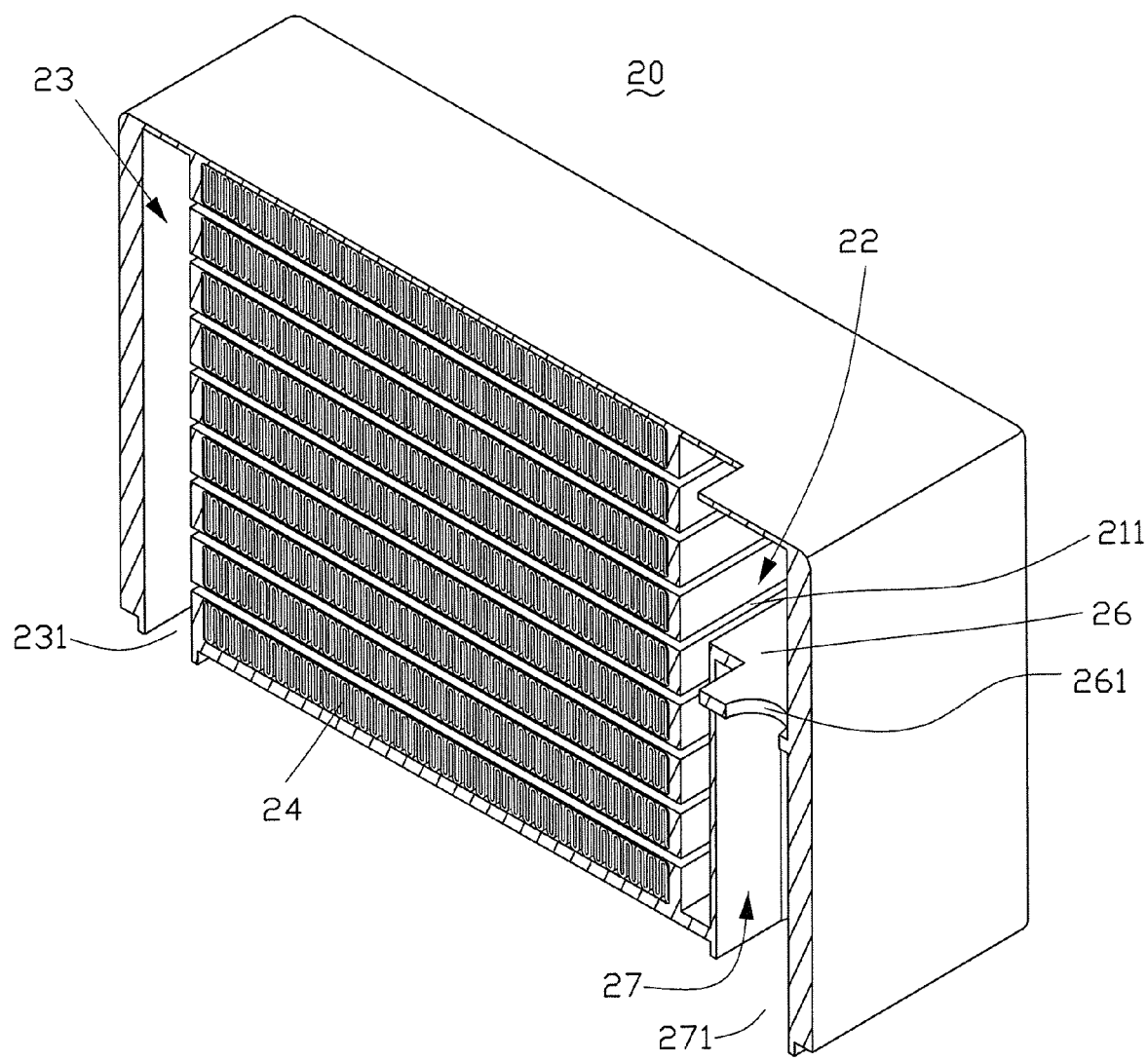
FIG. 6 is a sectioned isometric view of a heat dissipating member of the liquid cooling system of FIG. 1.

The heat dissipating member 20 includes a plurality of connecting conduits 21 disposed in parallel with each other and first and second fluid reserve housings 22, 23 located at respective opposite sides of these connecting conduits 21. With reference also to FIG. 6, a fin member 24 is sandwiched between every adjacent two connecting conduits 21 and is maintained in thermal contact with the corresponding connecting conduits 21. Each of the connecting conduits 21 defines therein a fluid passage 211, which is communicated with the first and second fluid reserve housings 22, 23. The first and second fluid reserve housings 22, 23 are used to reserve a predetermined quantity of the coolant in the liquid cooling system 100 and operate to allocate the coolant reserved therein evenly over the fluid passages 211 of the connecting conduits 21.

In order to receive the pump 15 in the heat dissipating member 20, the first fluid reserve housing 22 is dimensioned to have a size larger than that of the second fluid reserve housing 23 and is partitioned by a L-shaped partition plate 26 to form a sub-housing 27 within the first fluid reserve housing 22 for receiving the pump 15 therein. The second fluid reserve housing 23 has an opening 231 at a bottom thereof, as shown in FIGS. 3 and 6, wherein the opening 231 has a size substantially the same as that of the second recess 122 of the supporting base 12. Similarly, the pump receiving sub-housing 27 has an opening 271 at a bottom thereof and the opening 271 has a size substantially the same as that of the first recess 121 of the supporting base 12. Particularly, the openings 231, 271 are so dimensioned that, when the heat dissipating member 20 is mounted to the supporting base 10, the pump receiving sub-housing 27 and the second fluid reserve housing 23 are hermetically connected with the first and second recesses 121, 122 of the supporting base 12, respectively. That is, the heat dissipating member 20 is mounted to the heat absorbing member 10 in a press-fit manner. Alternatively, gaskets or similar devices may be used during assembly of the heat dissipating member 20 to the supporting base 12 in order to maintain a good sealing effect.

The pump 15, as illustrated schematically in present liquid cooling system 100, has an inlet 152 and an outlet 153 at top and bottom portions thereof, respectively, as shown in FIGS. 2-3. As the pump 15 is fixedly secured in the pump receiving sub-housing 27, the inlet 152 thereof is captured within an aperture 261 defined in the L-shaped partition plate 26, as shown in FIG. 6. The outlet 153 of the pump 15 is positioned in an aperture (not labeled) defined in a positioning seat 16, which is received in the pump receiving sub-housing 27 and fixedly positioned at a location near the opening 271 of the pump receiving sub-housing 27, whereby the pump 15 is maintained in fluid communication with both the first fluid reserve housing 22 of the heat dissipating member 20 and the first recess 121 of the supporting base 12.

In the present liquid cooling system 100, the heat absorbing member 10, the heat dissipating member 20 and the pump 15 are maintained in fluid communication with each other. Thus, a heat transfer loop is established inside the liquid cooling system 100. In operation, the heat absorbing plate 11 of the heat absorbing member 10 is maintained in thermal contact with the CPU of the computer to which the liquid cooling system 100 is applied. As passing through the fluid flow channel 115 of the heat absorbing member 10, the coolant receives the heat generated by the CPU. Under the driving of the pump 15, the coolant flows towards the heat dissipating member 20 where the heat of the coolant is released. Particularly, the heat of the coolant is taken away by the fin members 24 of the heat dissipating member 20 as the coolant flows through the fluid passages 211 of the connecting conduits 21. The fin members 24 dissipate the heat to a surrounding atmosphere. Thereafter, the coolant as cooled down is sent back to the fluid flow channel 115, whereby the heat of the CPU is continuously removed away as the coolant is continuously circulated through the heat transfer loop of the liquid cooling system 100.

In the present liquid cooling system 100, the heat absorbing member 10, the heat dissipating member 20 and the pump 15 are connected together without utilizing any separate pipe. The assembly of these components of the liquid cooling system 100 is simplified, and the present liquid cooling system 100 is made to have an integrated and compact structure, as shown in FIG. 1. Since no connecting pipes or fittings are required, the liquid leakage problem associated with the pipe connections is also eliminated. By addressing a limited number of the fasteners 18, the liquid cooling system 100 as a whole can be easily mounted to the computer in which the CPU is installed.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A liquid cooling system comprising:
   a heat absorbing member defining therein a fluid flow channel for passage of a coolant;
   a heat dissipating member mounted to the heat absorbing member, the heat dissipating member including first and second housing members arranged separately and a plurality of conduits connected between the first and second housing members, the first and second housing members each being in fluid communication with the fluid flow channel of the heat absorbing member; and
   a pump received in one of the first and second housing members and configured for driving the coolant to circulate through said fluid flow channel, said first and second housing members and said conduits;
   wherein the heat absorbing member defines therein first and second recesses corresponding to the first and second housing members of the heat dissipating member, and the first and second housing members are press-fitted to the first and second recesses, respectively.

2. The liquid cooling system of claim 1, wherein each of the first and second recesses is in fluid communication with the fluid flow channel via a passage defined between a corresponding recess and the fluid flow channel in the heat absorbing member.

3. The liquid cooling system of claim 1, wherein the first and second housing members are located at opposite sides of the heat dissipating member, respectively, and a fin member is sandwiched between every adjacent two conduits.

4. The liquid cooling system of claim 1, wherein the fluid flow channel has a serpentine configuration.

5. The liquid cooling system of claim 1, wherein the heat dissipating member further includes a fin member in thermal contact with the conduits, the fin member dissipating heat in the coolant to a surrounding atmosphere.

6. The liquid cooling system of claim 1, wherein the heat absorbing member includes a supporting base providing support for the heat dissipating member and a heat absorbing plate adapted for contacting a heat generating component.

7. The liquid cooling system of claim 6, wherein the fluid flow channel is formed by a plurality of slots, the slots being defined by a plurality of partition plates formed on the supporting base.

8. The liquid cooling system of claim 6, wherein the fluid flow channel is formed by a plurality of slots, the slots being defined by a plurality of partition plates which are integrally formed with the heat absorbing plate.

9. The liquid cooling system of claim 6, wherein the heat absorbing plate is made of metal material and the supporting base is made of non-metal material.

10. The liquid cooling system of claim 6, wherein the supporting base defines a through hole for receiving the heat absorbing plate therein.

11. A liquid cooling system comprising:
    a heat absorbing member including a supporting base, a heat absorbing plate adapted for thermally contacting with a heat generating component, and a fluid flow channel through which a coolant flows to take heat away from the heat absorbing plate;
    a heat dissipating member mounted on the supporting base of the heat absorbing member; and
    a pump received in the heat dissipating member for driving the coolant to flow through the heat dissipating member and the fluid flow channel, the heat in the coolant being dissipated to a surrounding atmosphere by flowing through the heat dissipating member;
    wherein the heat dissipating member has first and second fluid reserve housings located at respective opposite sides of the heat dissipating member and a conduit between the first and second fluid reserve housings, the coolant flowing from the first reserve housing to the second reserve housing through the conduit, the heat dissipating member further having a fin member in thermal contact with the conduit, the fin member dissipating the heat in the coolant to the surrounding atmosphere.

12. The liquid cooling system of claim 11, wherein the fluid flow channel has a serpentine configuration.

13. The liquid cooling system of claim 11, wherein the pump is accommodated in the first fluid reserve housing.

14. The liquid cooling system of claim 11, wherein the fluid flow channel is defined by the supporting base in cooperation with the heat absorbing plate.

15. The liquid cooling system of claim 11, wherein the fluid flow channel is defined by the heat absorbing plate alone.

* * * * *